(12) United States Patent
Tung et al.

(10) Patent No.: US 7,439,090 B2
(45) Date of Patent: Oct. 21, 2008

(54) METHOD FOR MANUFACTURING A LOWER SUBSTRATE OF A LIQUID CRYSTAL DISPLAY DEVICE

(75) Inventors: Yi-Pin Tung, Hsin-Chu (TW); Chin-Kuo Ting, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/812,404

(22) Filed: Jun. 19, 2007

(65) Prior Publication Data

US 2008/0113461 A1    May 15, 2008

(30) Foreign Application Priority Data

Nov. 15, 2006    (TW) .............................. 95142226 A

(51) Int. Cl.
*H01L 21/00* (2006.01)
(52) U.S. Cl. .................. 438/30; 438/15; 438/158.1; 257/E29.151
(58) Field of Classification Search .................. 438/30, 438/149–167; 257/E29.151; 345/87, 92; 349/42–44
See application file for complete search history.

(56) References Cited

U.S. PATENT DOCUMENTS 6,057,896 A * 5/2000 Rho et al. ...................... 349/42
2003/0013236 A1* 1/2003 Nakata et al. ............... 438/149

* cited by examiner

*Primary Examiner*—Brook Kebede
(74) *Attorney, Agent, or Firm*—Bacon & Thomas, PLLC

(57) ABSTRACT

A method for manufacturing a lower substrate of a liquid crystal display device is disclosed and more particularly, a method for manufacturing a color filter layer on a lower substrate is disclosed. This method is achieved by using a photosensitive insulating layer as a passivation layer or an overcoat of a thin film transistor to reduce the number of masks, or of photographic steps. The photosensitive insulating layer used in the method has the characteristics of both photoresist and passivation layers so as to protect a thin film transistor from moisture and oxygen. In addition, the number of masks, or of photographic steps used in this method can be further reduced by ink-jet printing a color filter layer or by half-tone mask technique.

20 Claims, 13 Drawing Sheets

METHOD FOR MANUFACTURING A LOWER SUBSTRATE OF A LIQUID CRYSTAL DISPLAY DEVICE

BACKGROUND OF THE INVENTION

1. Field of the Invention

The present invention relates to a method for manufacturing a thin film transistor array substrate of a liquid crystal display device, and more particularly, to a method for manufacturing a color filter layer on a thin film transistor array substrate.

2. Description of Related Art

A thin film transistor liquid crystal display (TFT-LCD) mainly comprises a thin film transistor (TFT) array substrate, a color filter substrate and a liquid crystal layer sandwiched therebetween. The TFT array substrate comprises plural pixels in an array, each of which comprises a TFT and a pixel electrode electrically connected to the TFT. Generally, the aperture ratio of a single pixel in the TFT-LCD device directly relates to the quantity of light passing through transparent areas from back light modules. For the TFT-LCD devices having the same power consumption, a higher aperture ratio means a better brightness of TFT-LCD devices.

However, in the process for assembling the TFT array substrate and the color filter substrate, since in practice the black matrix, quite often, cannot align with the color filter accurately, the resulting alignment shift usually causes leakage of light. Hence, in the conventional process for manufacturing a TFT array substrate of an LCD device, the black matrix is designed to be broader than the desired area to be blocked so as to completely inhibit the leakage. However, the aperture ratio of the LCD device is thereby reduced.

In order to obviate the aforementioned problems, a COA (color filter on array) technology has been developed. A COA-TFT substrate of a LCD device is provided to enhance the aperture ratio, and the resolution as well.

FIGS. 1A to 1G are cross-section views of a conventional method for manufacturing a COA-TFT by nine photographic steps. As shown in FIG. 1A, a first metal layer 102 is first formed on a substrate 101 by sputtering, and a gate and other elements of a transistor are defined. Subsequently, as shown in FIG. 1B, SiNx or SiOx as a gate insulating layer 103, a-Si as a semiconductor layer 104, and n⁺Si as an ohmic contact layer 105 are formed by PECVD, and then a patterned active region is formed by a photographic step. Then, as shown in FIG. 1C, Ti/Al/Ti or Ti/Al as a second metal layer 106 is formed by sputtering, a source and a drain are defined by a photographic step, and the ohmic contact layer 105 is etched to form a through hole by dry etching. As shown in FIG. 1D, SiNx or SiOx as a passivation layer 107 is formed by chemical vapor deposition. Subsequently, a patterned black matrix 108 is formed by coating a photosensitive black resin layer, pre-baking, and then a photographic step.

After the above process, a red filter layer 109 and a contact hole 110 are formed simultaneously by coating a photosensitive red resin layer, pre-baking, and then a photographic step. Subsequently, a green filter layer 111 in the green pixel region, a blue filter layer (not shown) in the blue pixel region, and the contact holes thereof (not shown) are formed by repeating the process for preparing the red pixel region, as the structure in FIG. 1E. Then, an overcoat 112 and a photoresist (not shown) are formed in sequence by coating, and then a contact hole 113 is formed by a photographic process, as the structure shown in FIG. 1F. Finally, as shown in FIG. 1G, a transparent electrode layer 114 is formed by plating, and a patterned pixel region is defined by a photographic step to accomplish the process for preparing a COA-TFT.

As the aforementioned illustration, the conventional process for manufacturing a COA-TFT includes five photographic steps for preparing a TFT array substrate and four photographic steps for preparing a color filter substrate (a total of nine photographic steps). Distinctly, the process for manufacturing a COA-TFT can enhance the aperture ratio, but the complex photographic steps would reduce the yield throughout.

Thereby, in order to reduce the manufacturing cost, and to enhance the yield and the stability of the products, how to simplify the photographic process for preparing a COA-TFT becomes an important issue.

SUMMARY OF THE INVENTION

The present invention takes a photosensitive insulating layer as a passivation layer or an overcoat of a TFT to reduce the number of masks or simplify the manufacturing process. In addition, the number of masks or the manufacturing process is further reduced or simplified by a technique of ink-jet printing in forming a color filter layer or half-tone mask.

The present invention provides a process for manufacturing a lower substrate of an LCD device, comprising: (A) providing a substrate; (B) forming plural transistors each comprising a gate, a source, and a drain, wherein the gate is on substrate, at least one semiconductor layer and at least one gate insulating layer are sandwiched in between the gate and the source/drain, and the drain does not electrically connect to the source; (C) forming on the substrate in sequence a first photosensitive insulating layer and a black matrix, wherein the first insulating layer and the black matrix are both positive photoresists or negative photoresists; (D) patterning the first photosensitive insulating layer and the black matrix to cover the transistor regions, wherein the pattern of the first photosensitive insulating layer is the same as that of the black matrix; (E) forming on the substrate in sequence a second photosensitive insulating layer and a color filter layer, wherein the second photosensitive insulating layer and the color filter layer are both positive photoresists or negative photoresists; (F) patterning the second photosensitive insulating layer and the color filter layer, and simultaneously forming a first contact hole in the second photosensitive insulating layer and the color filter layer on the drain, wherein the first contact layer extends through the second photosensitive insulating layer and the color filter layer to expose the part drain; (G) selectively repeating the steps (E) and (F); and (H) forming on the substrate a patterned transparent electrode layer which electrically connects to the drain.

The first photosensitive insulating layer and the black matrix used in the process for preparing a lower substrate of an LCD device must be both positive photoresists or negative photoresists so as to pattern them simultaneously by a photographic step. In addition, the color filter layer and the second photosensitive insulating layer must also together be positive photoresists or negative photoresists so as to pattern them simultaneously by a photographic step, and that the photographic process can thereby be simplified.

The materials of the first and second photosensitive insulating layers of the present invention can be any photosensitive materials which can function as a passivation layer of the TFT so as to efficiently protect the TFT from moisture or oxygen in air. Preferably, the materials of the first and second photosensitive insulating layers are the materials containing major Si, and organic or inorganic matter to exhibit an excellent insulation property and an excellent transmittance property, and a function of development as general photoresists. More preferably, the materials of the first and second photosensitive insulating layers are the materials containing organic silsesquioxane (OSQ).

The drain of the present invention comprises a drain electrode and a drain line, and the drain line is a metal line extending from the drain electrode. The drain line can electrically connect the drain and the pixel electrode. If the lower substrate of the LCD device of the present invention contains an auxiliary capacitance, the drain line can function as the upper electrode of the auxiliary capacitance.

The structure of the gate of the present invention can be a single-layered structure or a multi-layered structure. Preferably, the structure of the gate is a single-layered structure of aluminum, tungsten, chromium, titanium, TiNx, aluminum alloy, chromium alloy, molybdenum, or a combination thereof, or a multi-layered structure comprising the aforementioned single-layered metal layer and a heat-resistant metal layer (such as Cr、Ta、Ti、MoW or an alloy thereof).

The drain and the source of the present invention can be single-layered or multi-layered metal layers. Preferably, the drain and the source are single-layered structures of aluminum, tungsten, chromium, titanium, TiNx, aluminum alloy, chromium alloy, molybdenum, or a combination thereof, or multi-layered structures comprising a heat-resistant metal layer (such as Cr、Ta、Mo), a wiring layer with low resistance (such as Al), and a middle conductive layer (such as Ti). More preferably, the drain and the source are multi-layered metal layers of Ti/Al/Ti or Ti/Al.

According to the present invention, the material of the semiconductor layer is not limited. Preferably, the material is an amorphous silicon material, or a polymorphous silicon material.

The gate insulating layer can suitably be of any insulation material. Preferably, the material is an organic material, an inorganic material, or the combination thereof. More preferably, the material is $SiO_2$, SiNx, $Si(OH)_4$, or the combination thereof.

The transparent electrode layer can suitably be of any transparent and conductive material. Preferably, the material is ITO, IZO, or ITZO.

In addition, according to the present invention, the colors of the color filter layers each corresponding to one TFT on the lower substrate of an LCD device can be the same or different. Preferably, the colors of the color filter layers neighboring with each other are different.

Furthermore, in addition to fabricating TFTs on the substrate, the process for manufacturing a lower substrate of an LCD device can further comprise a step for fabricating a connecting terminal region, or an auxiliary capacitance region on the substrate to provide a complete lower substrate of a TFT-LCD device.

As the aforementioned process, the present invention provides a first preferred embodiment to form a transistor region and a connecting terminal region on the substrate of an LCD device. The process of the first preferred embodiment of the present invention comprises the following steps: (A) providing a substrate; (B) forming plural transistor regions each comprising a gate, a source, and a drain, and simultaneously forming plural connecting terminal regions individually comprising at least one terminal line on the substrate, wherein the gate is on the surface of the substrate, at least one semiconductor layer and at least one gate insulating layer are sandwiched in between the gate and the source/drain, the drain does not electrically connect to the source, and the gate insulating layer is on the terminal line; (C) a first photosensitive insulating layer and a black matrix are formed on the substrate in sequence, wherein the first photosensitive insulating layer and the black matrix together are positive photoresists or negative photoresists; (D) patterning the first photosensitive insulating layer and the black matrix to cover the transistor regions, wherein the pattern of the first photosensitive insulating layer is the same as that of the black matrix; (E) a second photosensitive insulating layer and a color filter layer are formed on the substrate in sequence, wherein the second photosensitive insulating layer and the filter layer together are positive photoresists or negative photoresists; (F) patterning the second insulating layer and the color filter layer, simultaneously forming a first contact hole in the second insulating layer and the color filter layer on the drain, and a second contact hole in the connecting terminal region, wherein the first contact hole extends through the second photosensitive insulating layer and the color filter layer to expose the part drain, and the second contact hole at least extends through the second photosensitive insulating layer to expose the part gate insulating layer; (G) selectively repeating the steps (E) and (F); (G') dry etching the exposed gate insulating layer to expose the part terminal line; and (H) forming a patterned transparent electrode layer on the substrate, which electrically connects to the drain.

The present invention further provides a second preferred embodiment to form a transistor region and a connecting terminal region on the substrate. The process of the second preferred embodiment comprises the following steps: (A) providing a substrate; (B) forming plural transistor regions each comprising a gate, a source, and a drain, and simultaneously forming plural connecting terminal regions on the substrate, individually comprising at least one terminal line and at least one connecting line, wherein the gate and the terminal line are on the substrate, at least one semiconductor layer and at least one gate insulating layer are sandwiched in between the gate and the source/drain, the drain does not electrically connect to the source, the gate insulating layer is sandwiched in between the terminal line and the connecting line, and the connecting line connects to the terminal line via a through hole; (C) forming on the substrate in sequence a first photosensitive insulating layer and a black matrix, wherein both the insulating layer and the black matrix are positive photoresists or negative photoresists; (D) patterning the first photosensitive insulating layer and the black matrix to cover the transistor regions, wherein the pattern of the first photosensitive insulating layer is the same as that of the black matrix; (E) forming a second photosensitive insulating layer and a color filter layer on the substrate in sequence, wherein the second photosensitive insulating layer and the color filter layer together are positive photoresists or negative photoresists; (F) patterning the second photosensitive insulating layer and the color filter layer, simultaneously forming a first contact hole in the second photosensitive insulating layer and the color filter layer on the drain, and a second contact hole in the connecting terminal region, wherein the first contact hole extends through the second photosensitive insulating layer and the color filter layer to expose the part drain, and the second contact hole at least extends through the second photosensitive insulating layer to expose the part connecting line; (G) selectively repeating the steps (E) and (F); and (H) forming on the substrate a patterned transparent electrode layer which electrically connects to the drain.

The present invention further provides a third embodiment to form a transistor region and an auxiliary capacitance region on the substrate of an LCD device. The process of the third embodiment of the present invention is similar to the aforementioned process. However, in step (B), plural auxiliary capacitance regions each at least comprising a lower electrode, a gate insulating layer, and an upper electrode are formed on the substrate. The lower electrode is on the substrate, and the gate insulating layer is sandwiched in between the upper electrode and the lower electrode.

In addition, according to the present invention, the process for patterning the first photosensitive insulating layer and the black matrix, as described in step (D), is not limited. Preferably, the process for patterning the first photosensitive insulating layer and the black matrix is performed by a mask, exposure, and development. The process for forming the color filter layer of the step (F) is not limited. Preferably, the process is spin coating or ink-jet printing.

In addition to the aforementioned process, the present invention further provides another process for manufacturing a lower substrate of an LCD device to take a nonphotosensitive insulating layer as a passivation layer of the TFT, and a photosensitive insulating layer as an overcoat of the TFT to simplify the photographic process. The process comprises the following steps: (A) providing a substrate; (B) forming plural transistor regions each having a gate, a source, and a drain, wherein the gate is on the substrate, at least one semiconductor layer and at least one gate insulating layer are sandwiched in between the gate and the source/drain, and the drain does not electrically connect to the source; (C) forming a passivation layer, a black matrix, and a first photosensitive insulating layer on the substrate in sequence; (D) patterning the first photosensitive insulating layer and the black matrix to cover the transistor regions, wherein the pattern of the first photosensitive insulating layer is the same as that of the black matrix; (E) forming on the substrate in sequence a second photosensitive insulating layer and a color filter layer; (F) patterning the second photosensitive insulating layer and the color filter layer, and forming a first contact hole both in the second photosensitive insulating layer and the color filter layer on the drain, wherein the first contact hole extends through the second photosensitive insulating layer and the color filter layer to expose the part passivation layer; (G) selectively repeating the steps (E) and (F); (H) dry etching the passivation layer in the first contact hole to expose the part drain; and (I) forming on the substrate a patterned transparent electrode layer which electrically connects to the drain.

The drain of the present invention comprises a drain electrode and a drain line, and the drain line is a metal line extending from the drain electrode. The drain line can electrically connect the drain and the pixel electrode. If the lower substrate of an LCD device of the present invention contains an auxiliary capacitance, the drain line can function as an upper electrode of the auxiliary capacitance. The colors of the color filter layers, each corresponding to one TFT on the lower substrate of an LCD device, can be the same or different. Preferably, the colors of the color filter layers neighboring with each other are different.

In addition to fabricating TFTs on the substrate, the process for manufacturing a lower substrate of an LCD device can further comprise a step of fabricating on the substrate a connecting terminal region, or an auxiliary capacitance region so as to provide a complete lower substrate of a TFT-LCD device.

The present invention further provides a fourth embodiment to form a connecting terminal region on the substrate of an LCD device. The process of the fourth embodiment is similar to the aforementioned process. However, in step (B), plural connecting terminal regions, at least each comprising a terminal line, are formed on the substrate. The terminal line is on the substrate, and the gate insulating layer is sandwiched in between the terminal line and the passivation layer. Step (F) further comprises a step for simultaneously forming a second contact hole in the second photosensitive insulating layer and the color filter layer in each connecting terminal region. The second contact hole extends through the second photosensitive insulating layer and the color filter layer so as to expose part of the passivation layer. Step (H) further comprises a step for dry etching the passivation layer and the gate insulating layer in the second contact hole so as to expose part of the terminal line and to thereby form contact holes of the connecting terminal regions.

The present invention further provides a fifth embodiment to form an auxiliary capacitance region on the substrate of an LCD device. The process of the fifth embodiment of the present invention is similar to the aforementioned process. However, in step (B), plural auxiliary capacitance regions, at least each comprising a lower electrode, a gate insulating layer, and an upper electrode, are formed on the substrate. The lower electrode is on the substrate, and the gate insulating layer is sandwiched in between the upper electrode and the lower electrode.

In addition, the process for patterning the first photosensitive insulating layer and the black matrix of the step (D) is not limited. Preferably, the process for patterning the first photosensitive insulating layer and the black matrix is performed by a mask, exposure, and development. The process for forming the color filter layer of step (F) is not limited. Preferably, the process is spin coating or ink-jet printing.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 1A:
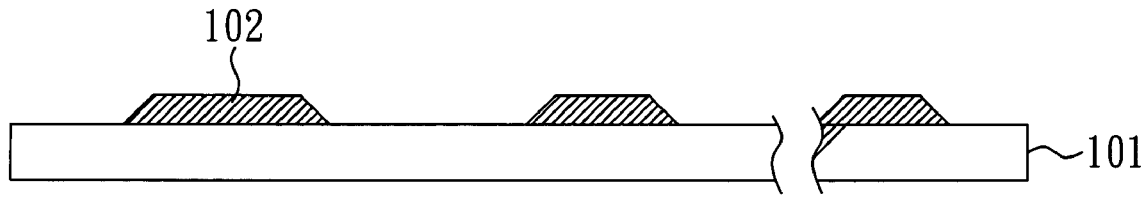
FIGS. 1A to 1G are cross-sectional views according to a conventional manufacturing method.
Figure 1B:
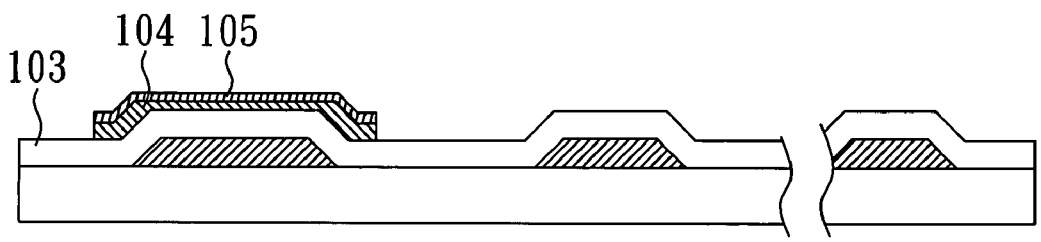
Figure 1C:
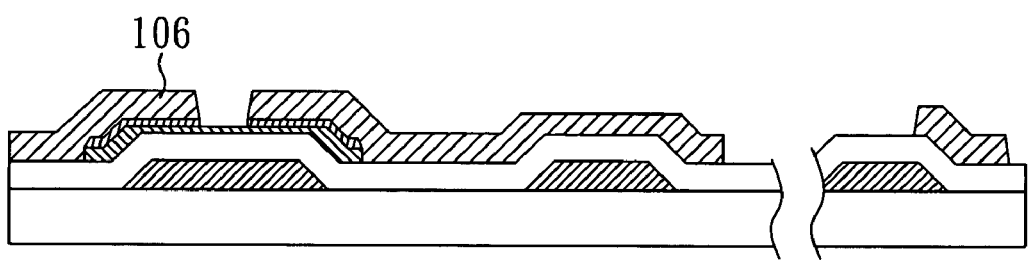
Figure 1D:
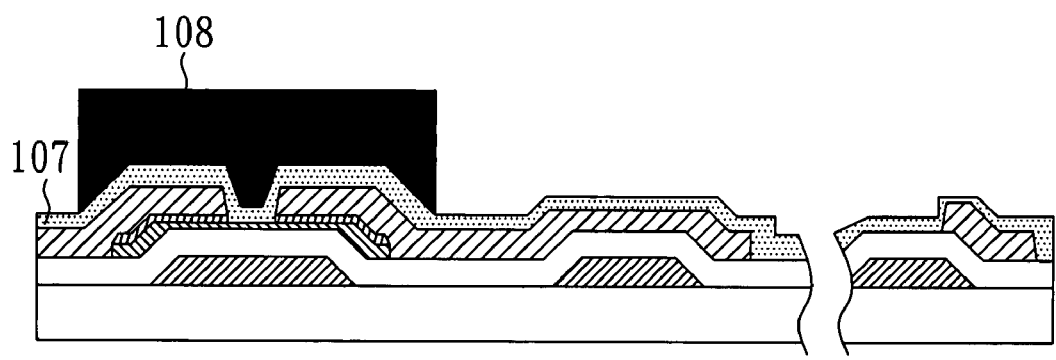
Figure 1E:
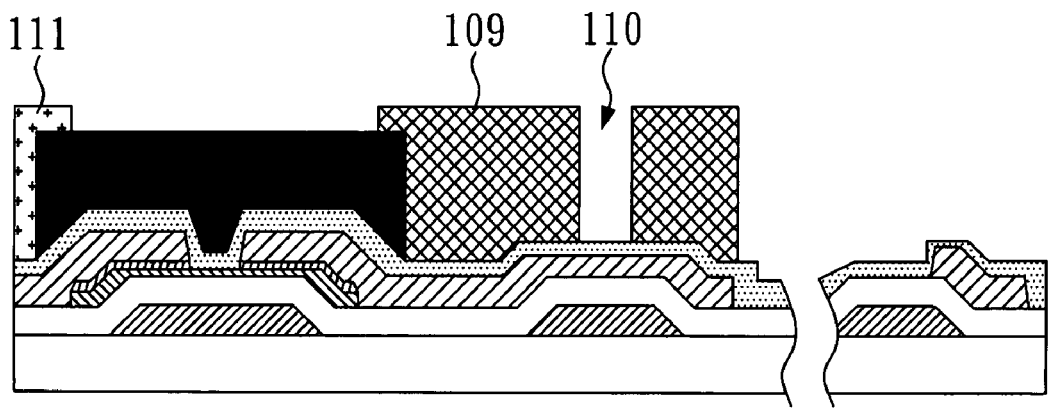
Figure 1F:
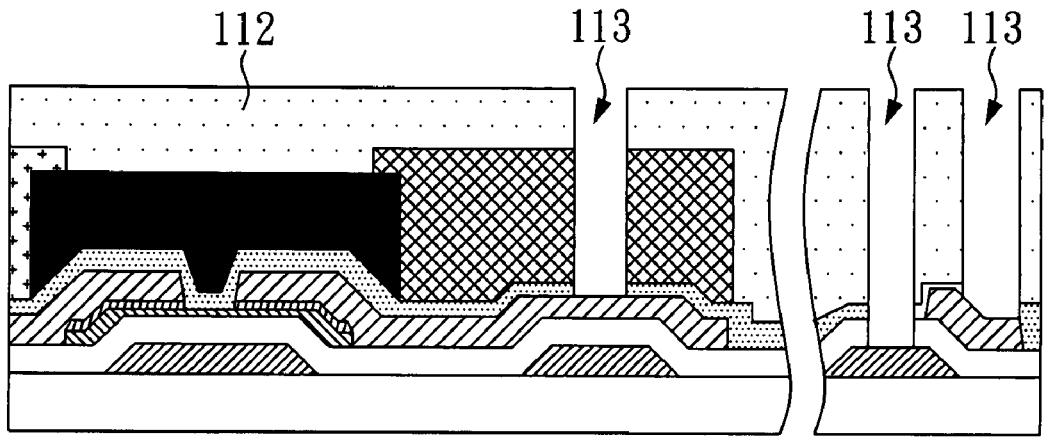
Figure 1G:
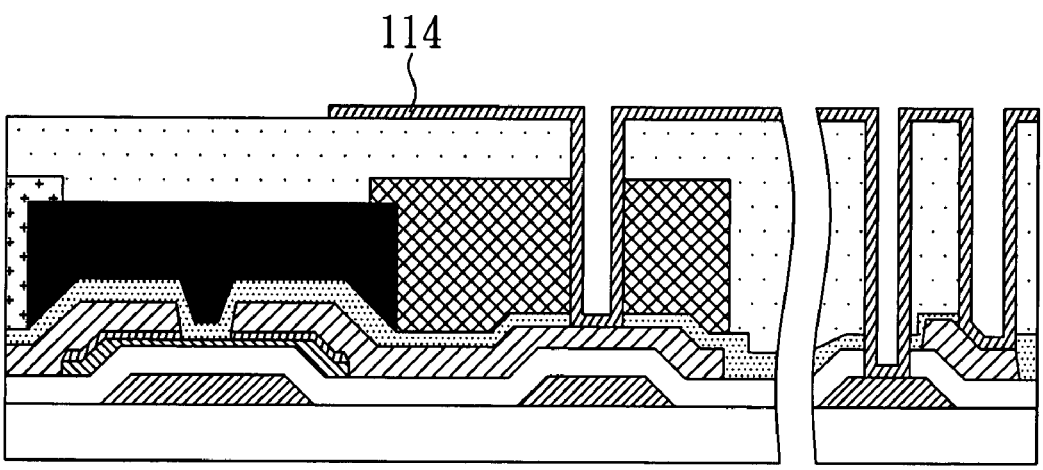

The present embodiment uses a photosensitive insulating layer as a passivation layer or an overcoat of the TFT so as to reduce the photographic steps by one.

Please refer to FIGS. 2A to 2G, wherein cross-sectional views illustrate the process for manufacturing a lower substrate of an LCD device of the present embodiment.

A first metal layer (not shown) is first formed on a substrate 201 by sputtering, and a gate 202 in the thin film transistor region A, a lower electrode 203 in the auxiliary capacitance region, and a terminal line 204 in the connecting terminal region are defined. Subsequently, a gate insulating layer 205

(SiNx) is formed by PECVD. Then, a semiconductor layer 208 (a-Si) and an ohmic contact layer 222 (n⁺Si) are formed by depositing, and then the semiconductor layer 208 and the ohmic contact layer 222 are patterned to form an active region. Subsequently, a second metal layer (not shown) of a Ti/Al/Ti multi-layered structure is formed by sputtering, and the second metal layer is patterned by exposure and development so as to form a source 209 and the drain 210 in the thin film transistor region A, an upper electrode 211 in the auxiliary capacitance region B, and a connecting line 212 in the connecting terminal region C. The Ti/Al/Ti multi-layered structure of the second metal layer is a three-layered structure so as to avoid etching the second metal layer for the developer used in the following process. Then, a through hole in the ohmic contact layer 222 is formed by dry etching, as the structure shown in FIG. 2A. In addition to Ti as a barrier layer (not shown in) on the second metal layer of the Ti/Al/Ti multi-layered structure, any material which can avoid etching the second metal layer for the developer (such as Mo, Cr, Ag and other metals which can avoid etching the second metal layer for the developer) can also function as a barrier layer. The upper electrode 211 in the auxiliary capacitance region B of the present embodiment is the metal line extending from the drain 210. Thereby, the drain 210 comprises a drain electrode and a drain line, and the drain line is a metal line extending from the drain electrode. The drain line can electrically connect the drain 210 and the pixel electrode (not shown), and function as well as an upper electrode 211 of the auxiliary capacitance region B.

Figure 2A:
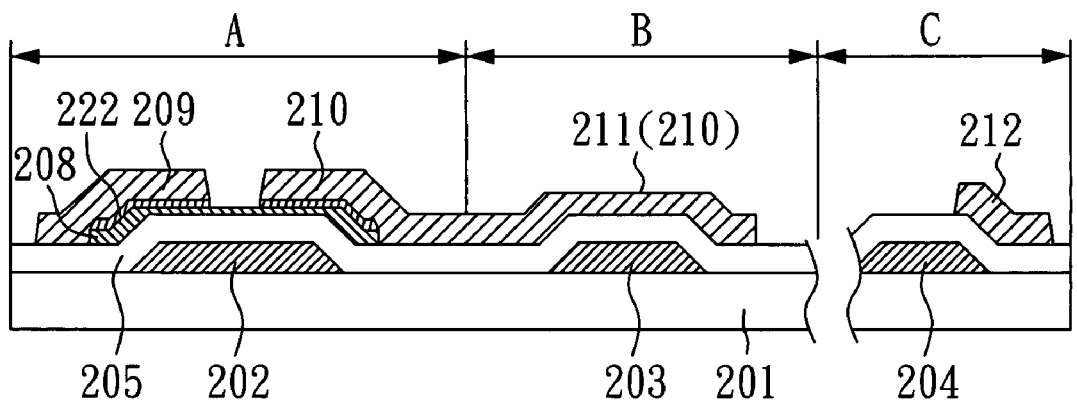
FIGS. 2A to 2G are cross-sectional views illustrating a manufacturing method according to a first embodiment of the present invention.
Figure 2B:
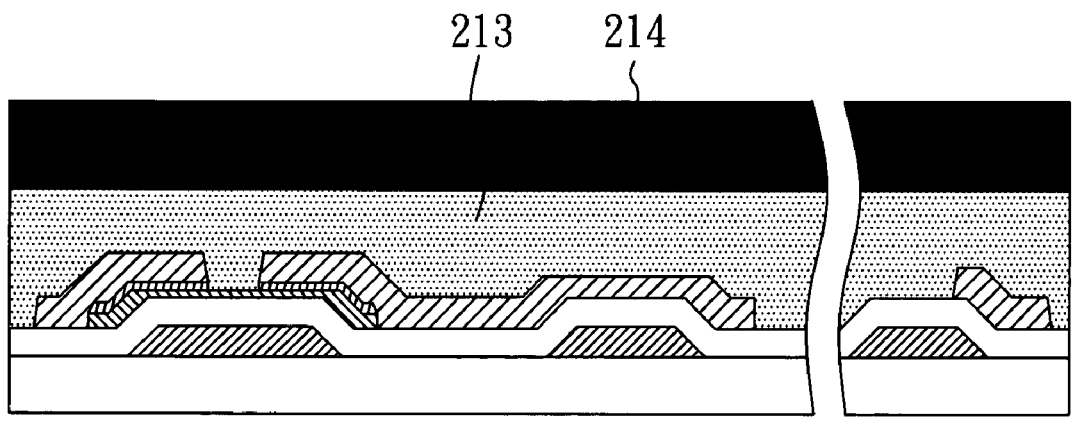
Figure 2C:
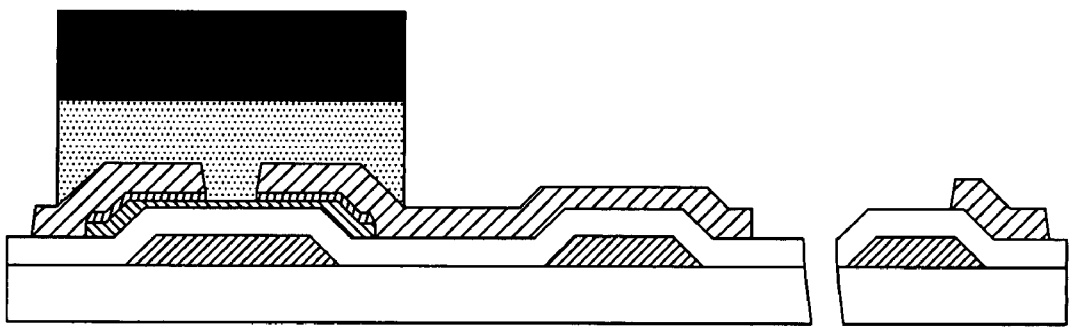

Subsequently, a first negative photosensitive insulating layer 213 is formed by coating and then by pre-baking. Then, a negative photosensitive black resin layer 214 is formed by coating and then by pre-baking, as shown in FIG. 2B. As shown in FIG. 2C, a mask is used for performing a photographic step to pattern the first negative photosensitive insulating layer 213 and the negative photosensitive black resin layer 214 so as to form a region blocking light. The patterned first negative photosensitive insulating layer 213 functions as a passivation layer of the TFT, and that the patterned negative photosensitive black resin layer 214 functions as the black matrix of the TFT.

Figure 2D:
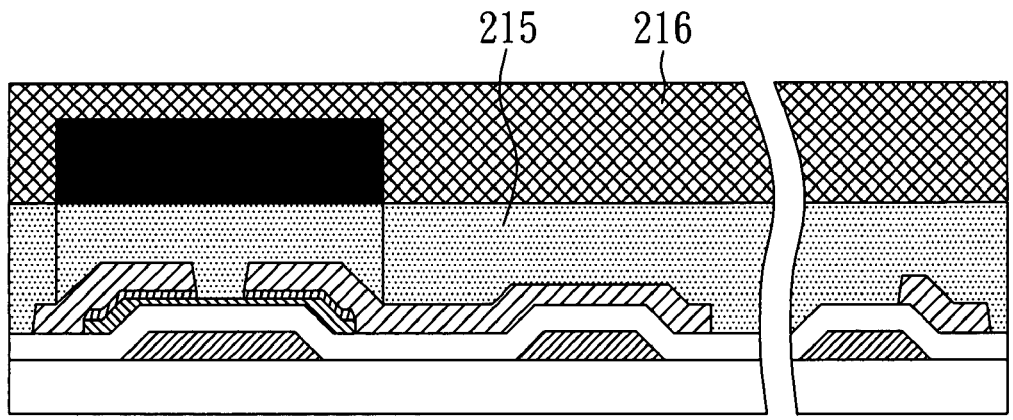

A second negative photosensitive insulating layer 215 is formed by coating and then by pre-baking. Then, a negative red filter layer 216 is formed by coating and then by pre-baking, as shown in FIG. 2D.

Figure 2E:
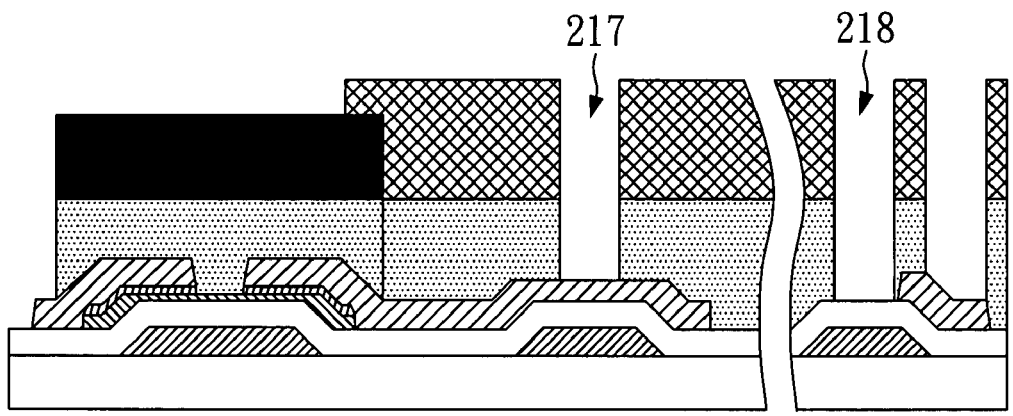

As shown in FIG. 2E, the negative red filter layer 216 and the second negative photosensitive insulating layer 215 are patterned by exposure and development, and a first contact hole 217 in the negative red filter layer 216 and a second contact hole 218 in the connecting terminal region C are formed. The first contact hole 217 of the present embodiment corresponds to the drain 210 and extends through the second negative photosensitive insulating layer 215 and the negative red filter layer 216 to expose the part drain 210. The second contact hole 218 is disposed in the connecting terminal region C, and extends through the second negative photosensitive insulating layer 215 and the negative red filter layer 216 so as to expose part of the gate insulating layer 205.

Figure 2F:
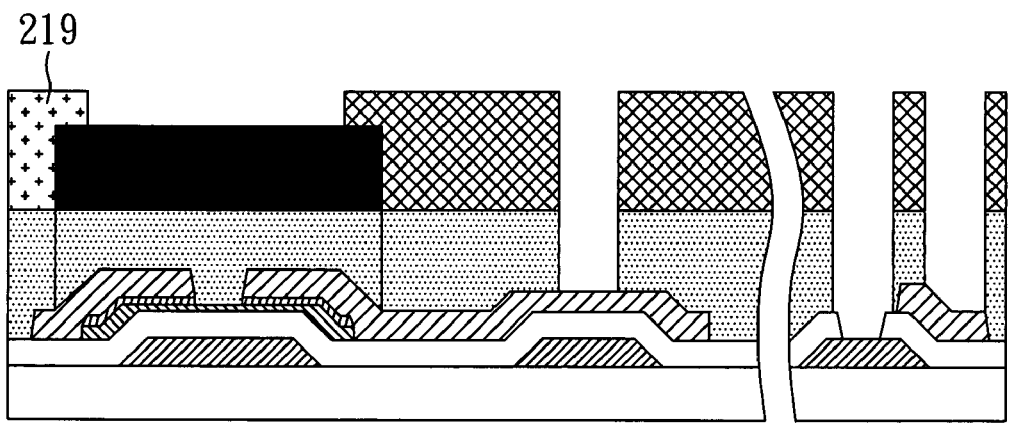

Subsequently, a green filter layer 219 is defined by repeating the steps of FIGS. 2D to 2E, and then a blue filter layer (not shown) is defined by repeating the steps illustrating in FIGS. 2D to 2E. Each pixel region of the present embodiment comprises a color filter layer of one color, and the colors of the color filter layers neighboring with each other are different. The photosensitive black resin layer and all color filter layers function as masks to dryly etch the gate insulating layer 205 in the second contact hole 218 in the connecting terminal region C so as to expose the terminal line 204, as shown in FIG. 2F.

Figure 2G:
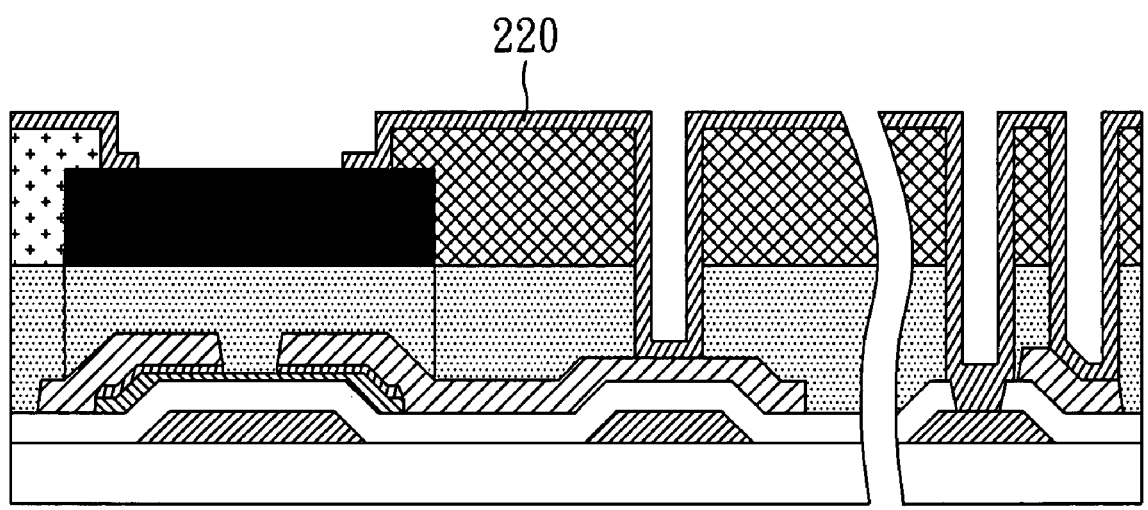

Finally, as shown in FIG. 2G, a transparent electrode layer (ITO) 220 is formed, and the pattern of the pixel region is defined by a photographic step so as to accomplish the process for manufacturing a lower substrate of an LCD device.

The process for manufacturing a lower substrate of an LCD device of the present embodiment comprises eight photographic steps. Thereby, the present embodiment reduces the photographic steps by one in comparison with the conventional process. In addition, a half-tone mask technology can further reduce the photographic steps by one in the present embodiment.

Embodiment 2

The present embodiment uses a photosensitive insulating layer as a passivation layer or an overcoat of the TFT to reduce the photographic steps by one. In addition, the present embodiment improves the method of Embodiment 1 to omit the dry-etching process for a contact hole in the connecting terminal region C, and to inhibit the issues of reduced thickness of the black matrix and the color filter layer resulting from ion impact.

Please refer to FIGS. 3A to 3G, wherein cross-sectional views illustrate the process for manufacturing a lower substrate of an LCD device of the present embodiment.

Figure 3A:
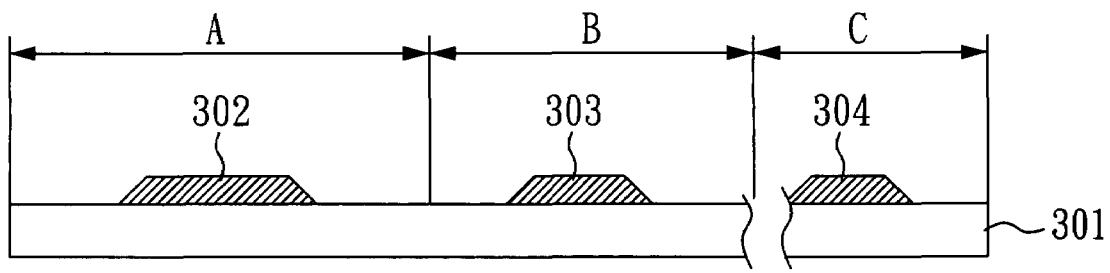
FIGS. 3A to 3G are cross-sectional views illustrating a manufacturing method of a second embodiment according to the present invention.
Figure 3B:
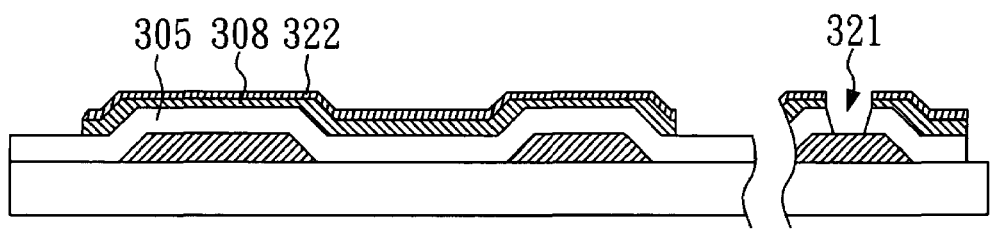
Figure 3C:
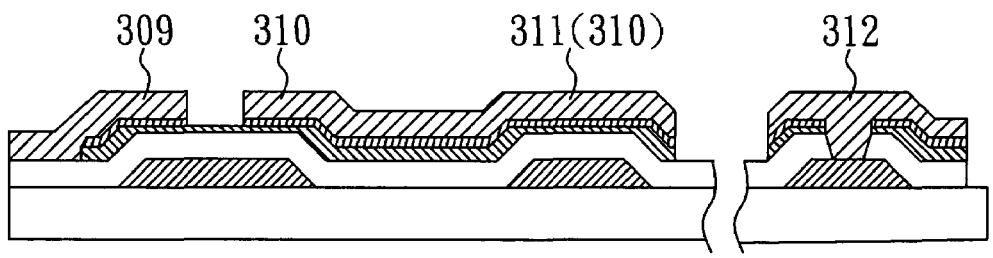

A first metal layer (not shown) is first formed on a substrate 301 by sputtering, and a gate 302 in the thin film transistor region A, a lower electrode 303 in the auxiliary capacitance region B, and a terminal line 304 in the connecting terminal region C are defined. As shown in FIG. 3B, a gate insulating layer 305 (SiNx) is formed by PECVD. Then, a semiconductor layer 308 (a-Si) and an ohmic contact layer 322 (n⁺Si) are formed by depositing; the semiconductor layer 308, the ohmic contact layer 322, and the gate insulating layer 305 are dryly etched by a photographic step; and then a through hole 321 extends through the semiconductor layer 308, the ohmic contact layer 322, and the gate insulating layer 305 to expose the terminal line 304 is formed in the connecting terminal region C. Subsequently, a second metal layer (not shown) of a Ti/Al/Ti multi-layered structure is formed by sputtering, and a photoresist layer (not shown) is coated to perform exposure and development; and the second metal layer is patterned by wet etching so as to define a source 309 and the drain 310 in the transistor region A, an upper electrode 311 in the auxiliary capacitance region B, and a connecting line 312 in the connecting terminal region C. The connecting line 312 connects to the terminal line 304 via the through hole 321. The Ti/Al/Ti multi-layered structure of the second metal layer is a three-layered structure so as to avoid etching the second metal layer for the developer used in the following process. Then, a through hole in the ohmic contact layer 322 is formed by dry etching, as the structure shown in FIG. 3C. The upper electrode 311 in the auxiliary capacitance region B of the present embodiment is a metal line extending from the drain 310. Thereby, the drain 310 comprises a drain electrode and a drain line, and the drain line is a metal line extending from the drain electrode. The drain line can electrically connect the drain 310 and the pixel electrode (not shown), and function as well as an upper electrode 311 of the auxiliary capacitance region B.

Figure 3D:
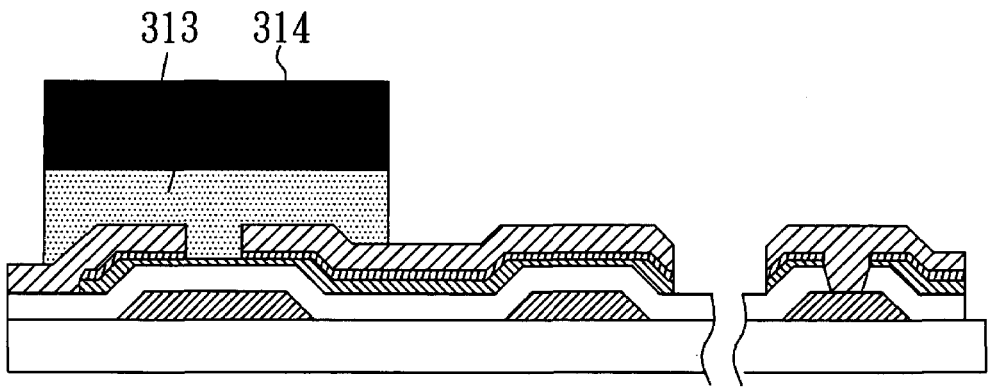

Subsequently, a first negative photosensitive insulating layer 313 is formed by coating and then by pre-baking. Then, a negative photosensitive black resin layer 314 is formed by coating and then by pre-baking. As shown in FIG. 3D, a mask is used for performing a photographic step to pattern the first negative photosensitive insulating layer 313 and the negative photosensitive black resin layer 314 so as to form a region blocking light. The patterned first negative photosensitive insulating layer 313 functions as a passivation layer of the TFT, and the patterned negative photosensitive black resin layer 314 functions as the black matrix of the TFT.

A second negative photosensitive insulating layer 315 is formed by coating and then by pre-baking. Then, a negative red filter layer 316 is formed by coating and then by pre-baking. Subsequently, the negative red filter layer 316 and the second negative photosensitive insulating layer 315 are patterned by exposure and development, and a first contact hole 317 in the negative red filter layer 316 and a second contact hole 318 in the connecting terminal region C are formed. The first contact hole 317 corresponds to the drain 310, and extends through the second negative photosensitive insulating layer 315 and the negative red filter layer 316 so as to expose part of the drain 310. The second contact hole 318 is disposed in the connecting terminal region C, and extends through the second negative photosensitive insulating layer 315 and the negative red filter layer 316 so as to expose part of the connecting line 312.

Figure 3E:
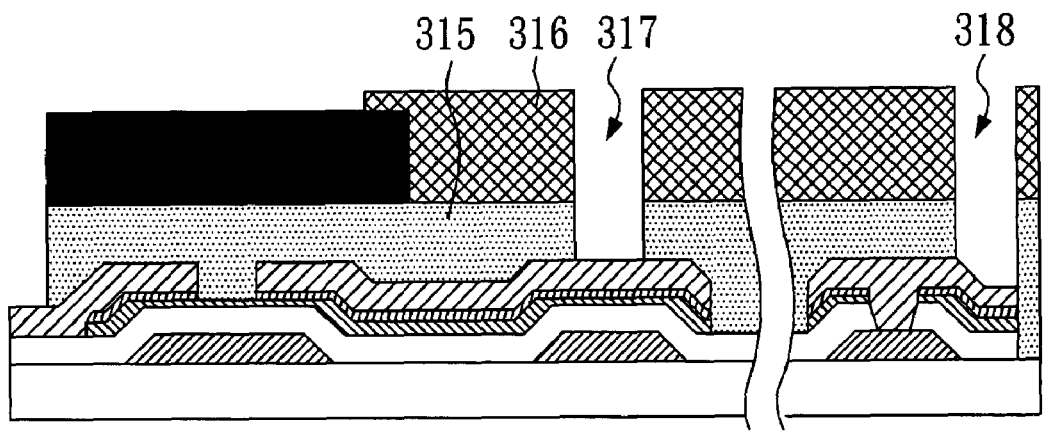
Figure 3F:
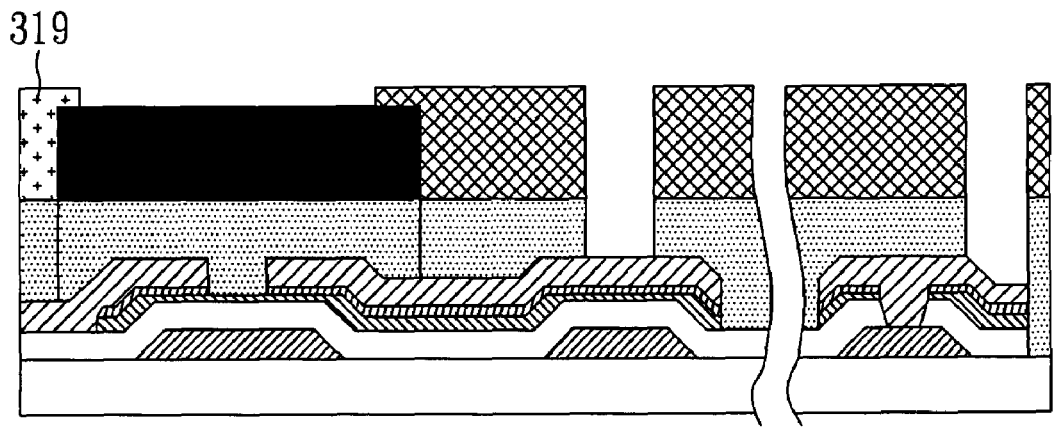

Subsequently, a green filter layer 319 is defined by repeating the steps of FIG. 3E, and then a blue filter layer (not shown) is defined by repeating the steps of FIG. 3E. Each pixel region of the present embodiment comprises a color filter layer of one color, and the colors of the color filter layers neighboring with each other are different, as shown in FIG. 3F.

Figure 3G:
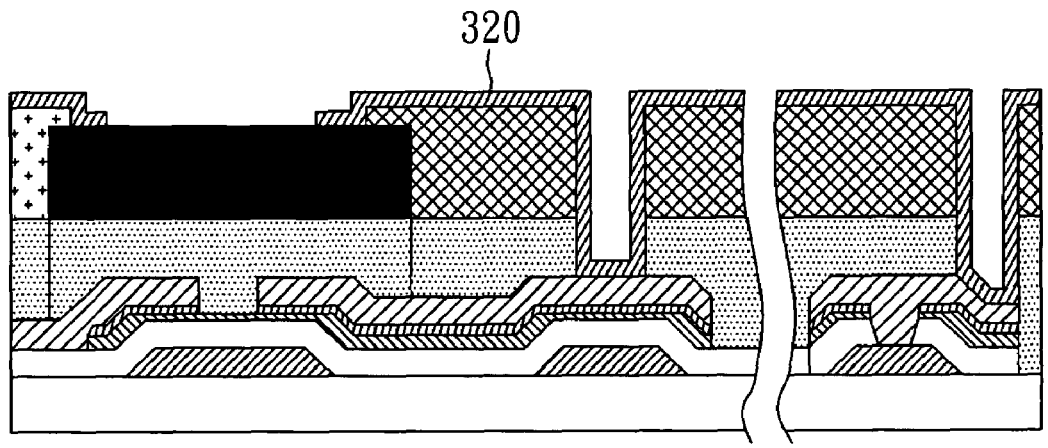

Finally, as shown in FIG. 3G, a transparent electrode layer (ITO) 320 is formed, and the pattern of the pixel region is defined by a photographic step so as to accomplish the process for manufacturing a lower substrate of an LCD device.

The process for manufacturing a lower substrate of an LCD device of the present embodiment comprises eight photographic steps. The photosensitive insulating layer of the present invention can function as the passivation layer or the overcoat of the TFT. Thereby, the present embodiment reduces the photographic steps by one and omits the process for coating an overcoat, in comparison with the conventional process. In addition, a half-tone mask technique can further reduce the photographic steps by one in the present embodiment.

Embodiment 3

The present embodiment uses a photosensitive insulating layer as a passivation layer or an overcoat of the TFT to reduce the photographic steps by one. In addition, the present embodiment improves the method of Embodiment 1 to further reduce the photographic steps by two via ink-jet printing so as to form three color filter layers of different colors. The manufacturing steps and the manufacturing cost are reduced due to reducing omitting the number of steps in photosensitive insulating layer coating.

Please refer to FIGS. 4A to 4F, wherein cross-sectional views illustrate the process for manufacturing a lower substrate of an LCD device of the present embodiment.

Figure 4A:
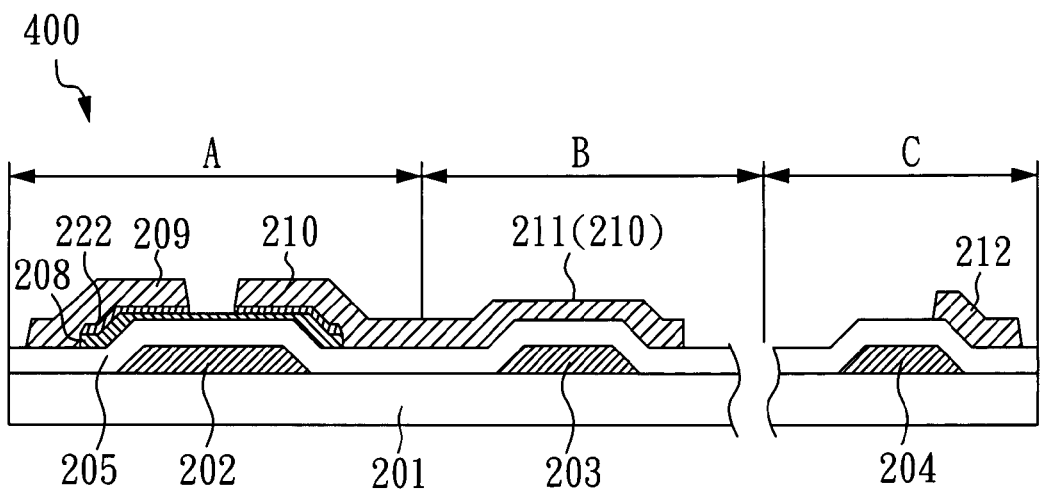
FIGS. 4A to 4F are cross-sectional views illustrating a manufacturing method according to a third embodiment of the present invention.

A lower substrate 400 of an LCD device is provided, as shown in FIG. 4A. The process for forming the lower substrate 400 is the same as the process for forming the structure of FIG. 2A of Embodiment 1.

Figure 4B:
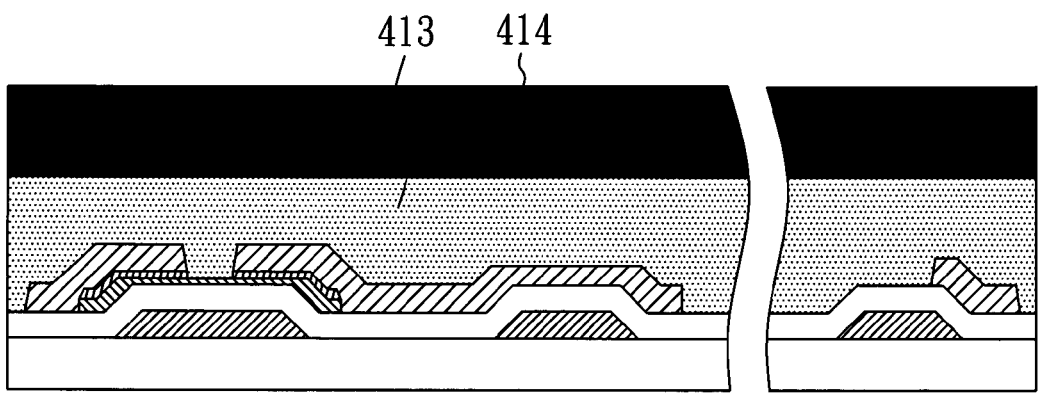
Figure 4C:
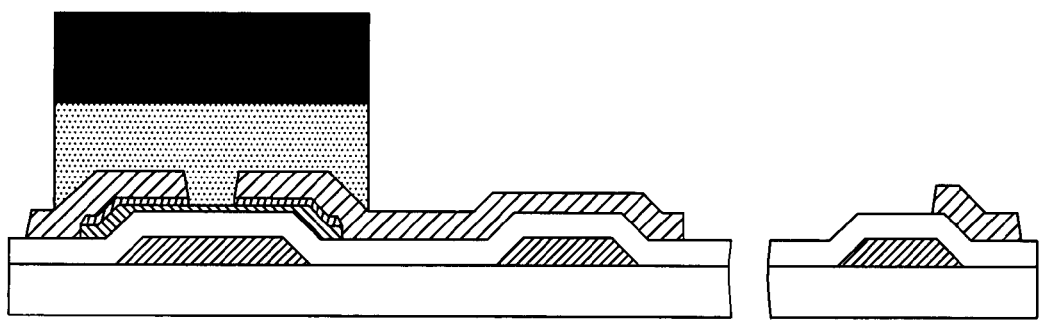

Subsequently, a first negative photosensitive insulating layer 413 is formed by coating and then by pre-baking. Then, a negative photosensitive black resin layer 414 is formed by coating and then by pre-baking, as shown in FIG. 4B. As shown in FIG. 4C, a mask is used for performing a photographic step in patterning the first negative photosensitive insulating layer 413 and the negative photosensitive black resin layer 414 so as to form a region blocking light. The patterned first negative photosensitive insulating layer 413 functions as a passivation layer of the TFT, and the patterned negative photosensitive black resin layer 414 functions as the black matrix of the TFT.

Figure 4D:
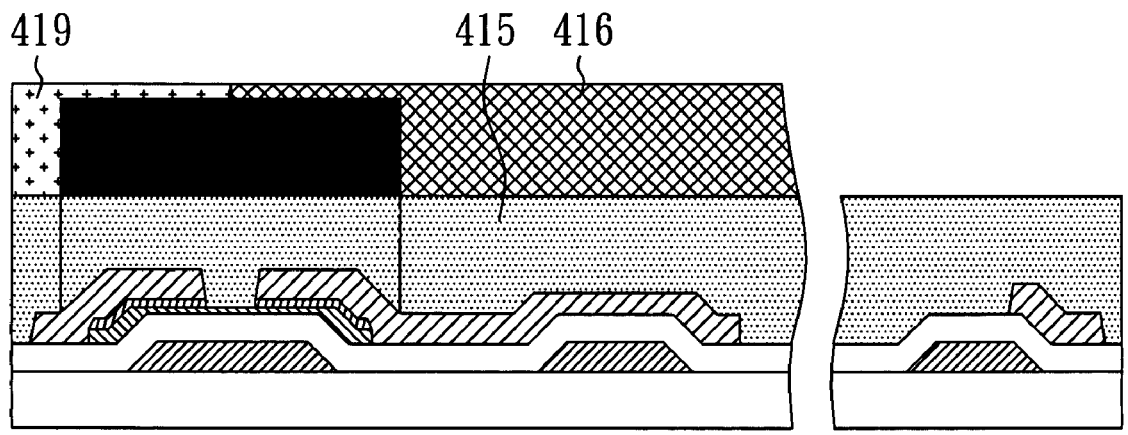

A second negative photosensitive insulating layer 415 is formed by coating and then by pre-baking. Then, a red filter layer 416 in the red pixel region, a green filter layer 419 in the green pixel region, and a blue filter layer (not shown) in the blue pixel region are formed by ink-jet printing and then by pre-baking, as shown in FIG. 4D. The three color filter layers are negative photoresists.

Figure 4E:
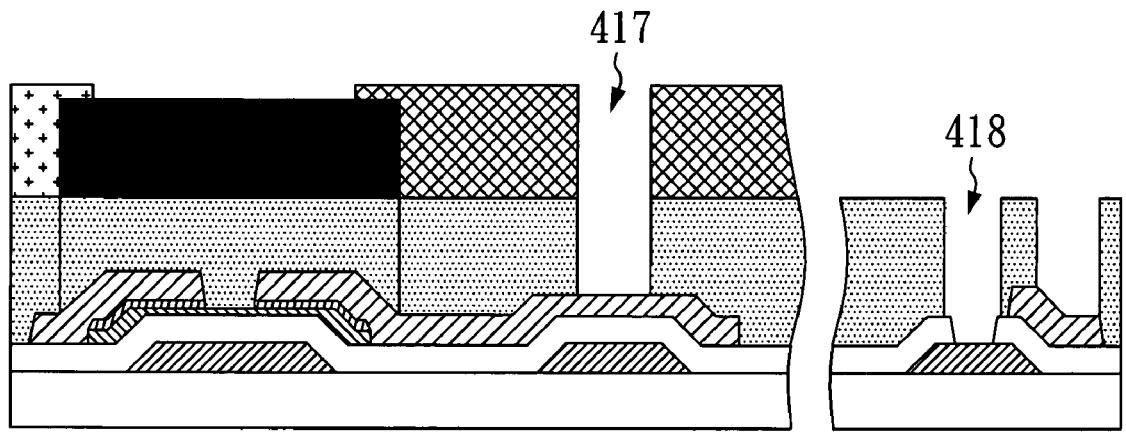

Subsequently, the red filter layer 416, the green filter layer 419, the blue filter layer (not shown), the first contact hole corresponding to the drain 210, and the second contact hole 418 in the connecting terminal region C are defined by a photographic step. For example, the first contact hole 417 corresponds to the drain 210, and extends through the red filter layer 416 and the second photosensitive insulating layer 415 so as to expose part of the drain 210. The second contact hole 418 is disposed in the connecting terminal region C, and extends through the second photosensitive insulating layer 415 so as to expose part of the gate insulating layer 205. Then, the black matrix and the color filter layers function as masks to dryly etch the gate insulating layer 205 in the second contact hole 418 so as to expose part of the terminal line 404, as shown in FIG. 4E.

Figure 4F:
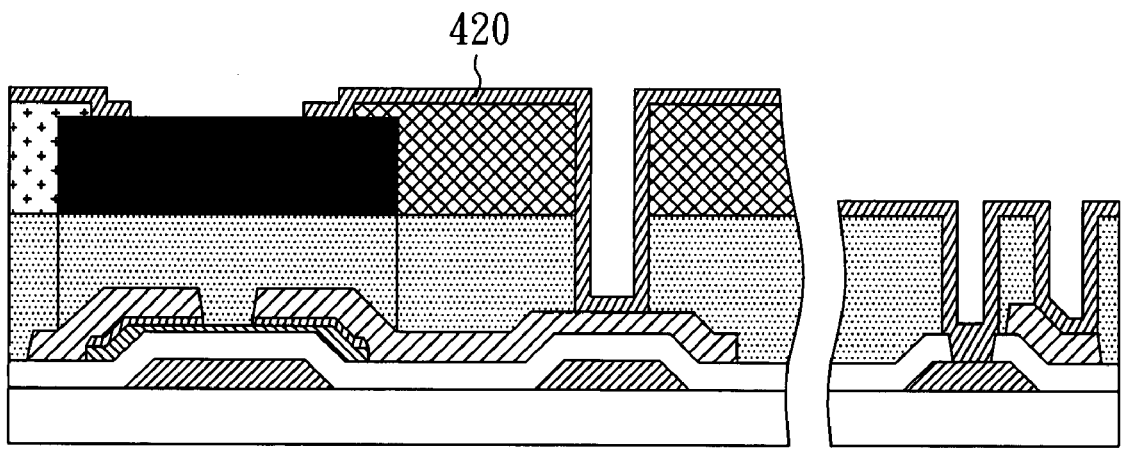

Finally, as shown in FIG. 4F, a transparent electrode layer (ITO) 420 is formed, and the pattern of the pixel region is defined by a photographic step so as to accomplish the process for manufacturing a lower substrate of an LCD device.

The process for manufacturing a lower substrate of an LCD device of the present embodiment comprises six photographic steps. The photosensitive insulating layer of the present invention can function as the passivation layer or the overcoat of the TFT. Thereby, the present embodiment reduces the photographic steps by three and omits the step for coating an overcoat, in comparison with the conventional process. In addition, a half-tone mask technique can further reduce the photographic steps by one in the present embodiment.

Embodiment 4

The present embodiment uses a photosensitive insulating layer as a passivation layer or an overcoat of the TFT to reduce the photographic steps by one. In addition, the present embodiment improves the method of Embodiment 2 to further reduce the photographic steps by two via ink-jet printing in forming three color filter layers of different colors. The manufacturing steps and the manufacturing cost are reduced by omitting the step for photosensitive insulating layer coating.

Now references to FIGS. 5A to 5D are made, wherein cross-sectional views illustrate the process for manufacturing a lower substrate of an LCD device of the present embodiment.

Figure 5A:
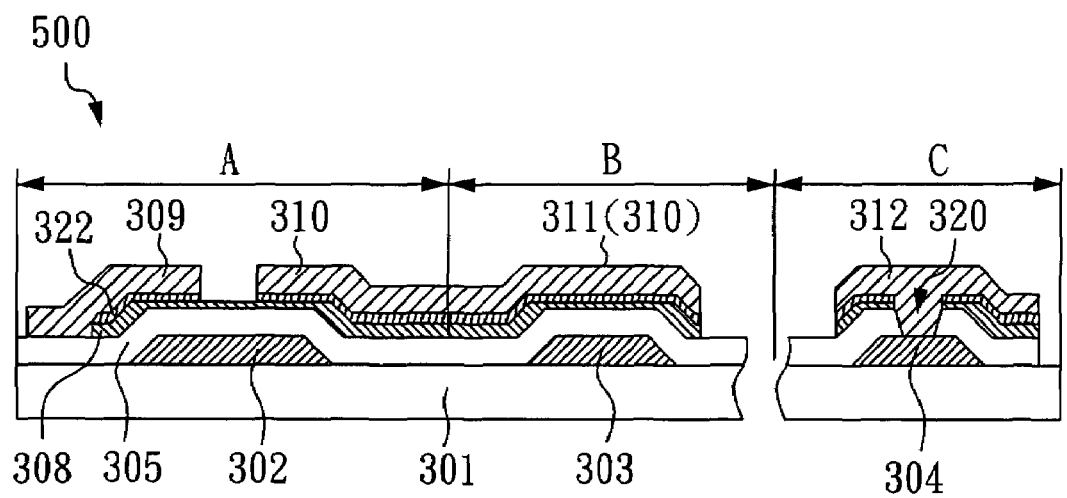
FIGS. 5A to 5D are cross-sectional views illustrating a manufacturing method according to a fourth embodiment of the present invention.

A lower substrate 500 of an LCD device is provided, as shown in FIG. 5A. The process for forming the lower substrate 500 is the same as the process for forming the structure of FIG. 3C of Embodiment 2.

Figure 5B:
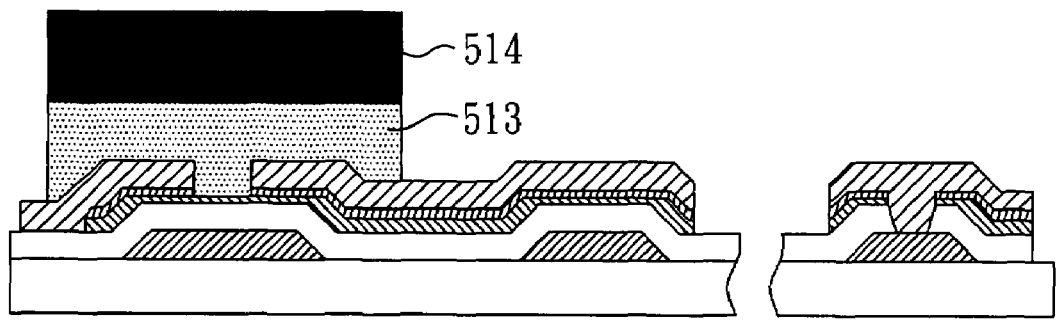

Subsequently, a first negative photosensitive insulating layer 513 is formed by coating and then by pre-baking. Then, a negative photosensitive black resin layer 514 is formed by coating and then by pre-baking. As shown in FIG. 5B, a mask is used for performing a photographic step to pattern the first negative photosensitive insulating layer 513 and the negative photosensitive black resin layer 514 to form a region blocking light. The patterned first negative photosensitive insulating layer 513 functions as a passivation layer of the TFT, and the patterned negative photosensitive black resin layer 514 functions as the black matrix of the TFT.

Figure 5C:
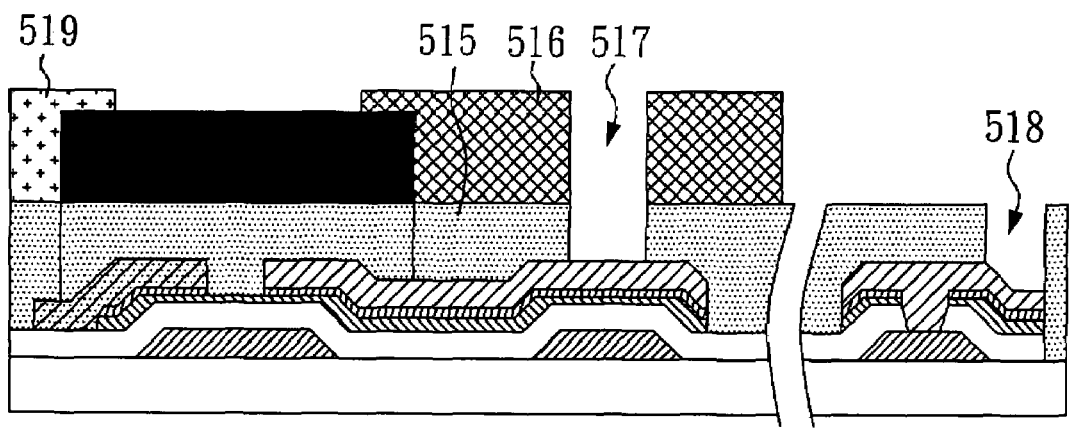

A second negative photosensitive insulating layer 515 is formed by coating and then by pre-baking. Then, a red filter layer 516 in the red pixel region, a green filter layer 519 in the green pixel region, and a blue filter layer (not shown) in the blue pixel region are formed by ink-jet printing and then by pre-baking. The three filter layers are negative photoresists. Subsequently, the red filter layer 516, the green filter layer 519, the blue filter layer (not shown), the first contact hole corresponding to the drain 310, and the second contact hole 518 in the connecting terminal region C are defined by a photographic step. For example, the first contact hole 517 corresponds to the drain 310, and extends through the red filter layer 516 and the second photosensitive insulating layer 515 so as to expose part of the drain 310. The second contact hole 518 is disposed in the connecting terminal region C, and extends through the second photosensitive insulating layer 515 so as to expose part of the connecting line 312, as shown in FIG. 5C.

Figure 5D:
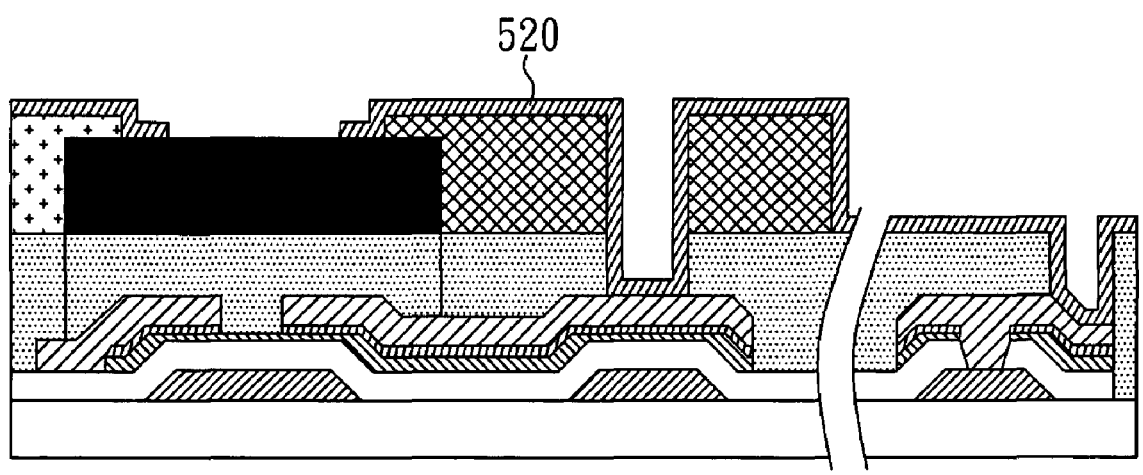

Finally, as shown in FIG. 5D, a transparent electrode layer (ITO) 520 is formed, and the pattern of the pixel region is defined by a photographic step so as to accomplish the process for manufacturing a lower substrate of an LCD device.

The process for manufacturing a lower substrate of an LCD device of the present embodiment comprises six photographic steps. The photosensitive insulating layer of the present invention can function as the passivation layer or the overcoat of the TFT. Thereby, the present embodiment reduces the photographic steps by three and omits the step for coating an overcoat, in comparison with the conventional process.

Embodiment 5

The present embodiment improves the process for manufacturing a lower substrate of an LCD device according to the conventional process (FIGS. 1A to 1G) to retain the passivation layer and use a photosensitive insulating layer as an overcoat of the TFT so as to reduce the photographic steps by one. In addition, since the transformation of the process is less, the process is performed more easily.

Referring to FIGS. 6A to 6G, wherein cross-sectional views of the process for manufacturing a lower substrate of an LCD device of the present embodiment are shown.

A first metal layer (not shown) is first formed on a substrate 601 by sputtering, and a gate 602 in the thin film transistor region A, a lower electrode 603 in the auxiliary capacitance region B, and a terminal line 604 in the connecting terminal region C are defined. Subsequently, a gate insulating layer 605 (SiNx) is formed by PECVD. Then, a semiconductor layer 608 (a-Si) and an ohmic contact layer 622 (n+Si) are formed by depositing, and then an active region is defined by coating a photoresist layer and then by patterning. Subsequently, a second metal layer (not shown) of a Ti/Al/Ti multi-layered structure is formed by sputtering, and the second metal layer is patterned by development and exposure so as to form a source 609 and the drain 610 in the transistor region A, an upper electrode 611 in the auxiliary capacitance region B, and a connecting line 612 in the connecting terminal region C. The Ti/Al/Ti multi-layered structure of the second metal layer is a three-layered structure so as to avoid etching the second metal layer for the developer used in the following process. Then, a through hole in the ohmic contact layer 622 is formed by dry etching, and a passivation layer 623 (SiNx or SiOx) is formed by chemical vapor deposition, as the structure shown in FIG. 6A.

Figure 6A:
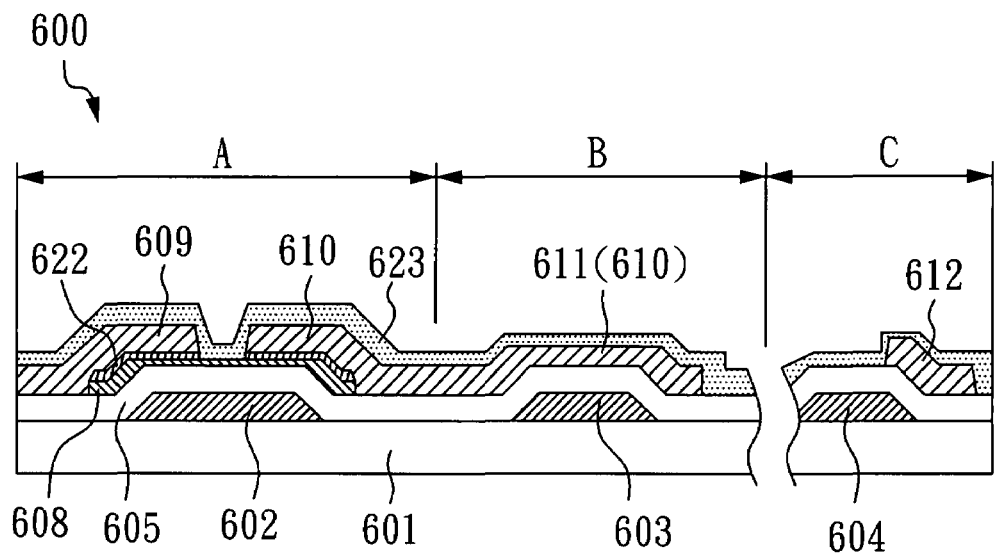
FIGS. 6A to 6D are cross-sectional views illustrating a manufacturing method according to a fifth embodiment of the present invention.
Figure 6B:
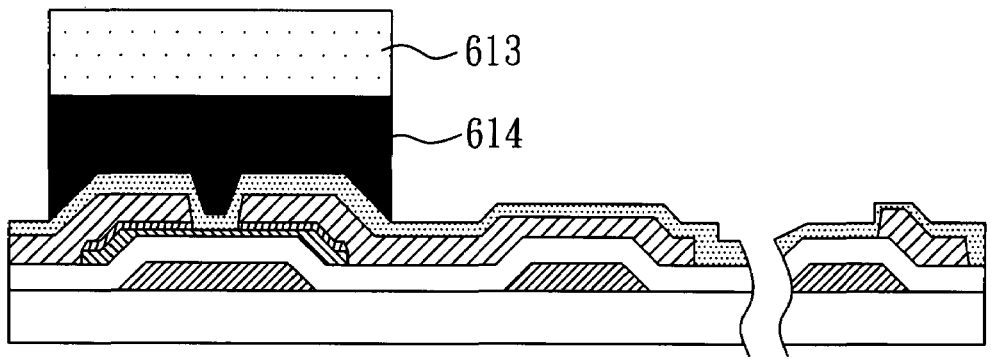

Subsequently, a negative photosensitive black resin layer 614 is forming by coating and then by pre-baking. Then, a first negative photosensitive insulating layer 613 is formed by coating and then by pre-baking. As shown in FIG. 6B, a mask is used for performing a photographic step to pattern the first negative photosensitive insulating layer 613 and the negative photosensitive black resin layer 614 to form a region blocking light. The patterned first negative photosensitive insulating layer 613 functions as an overcoat layer of the TFT, and the patterned negative photosensitive black resin layer 614 functions as the black matrix of the TFT.

Figure 6C:
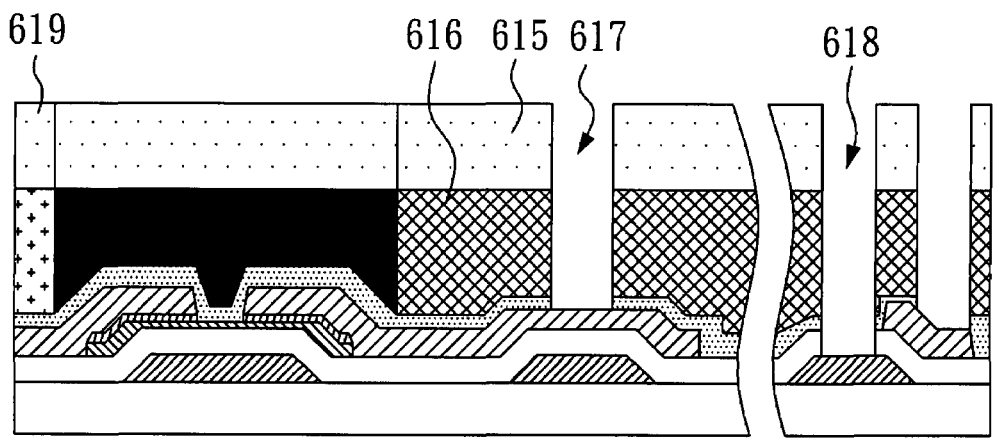

A negative red filter layer 616 is formed by coating and then by pre-baking. Then, a second negative photosensitive insulating layer 615 is formed by coating and then by pre-baking. The negative red filter layer 616 and the second negative photosensitive insulating layer 615 are patterned by exposure and development so as to define a first contact hole 617 in the negative red filter layer 616, corresponding to the drain 610, and a second contact hole 618 in the connecting terminal region C. Subsequently, a green filter layer 619, a blue filter layer (not shown), and the contact holes thereof (not shown) are defined by repeating the steps for forming the aforementioned color filter layer and the second photosensitive insulating layer. Each pixel region of the present embodiment comprises a color filter layer of one color, and the colors of the color filter layers neighboring with each other are different. The photosensitive black resin layer and all color filter layers function as masks to dryly etch the passivation layer 623 in the first contact hole 617 corresponding to the drain 610, and the passivation layer 623 and the gate insulating layer 605 in the second contact hole in the connecting terminal region C so as to expose the drain 610 and the terminal line 604, as shown in FIG. 6C.

Figure 6D:
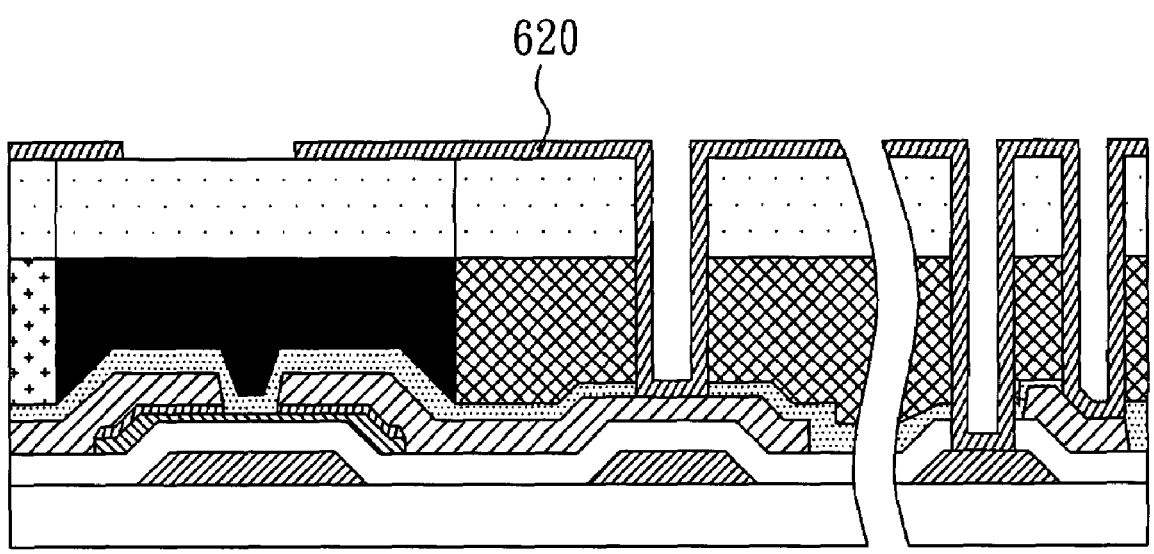

Finally, as shown in FIG. 6D, a transparent electrode layer (ITO) 620 is formed, and the pattern of the pixel region is defined by a photographic step so as to accomplish the process for manufacturing a lower substrate of an LCD device.

The process for manufacturing a lower substrate of an LCD device of the present embodiment comprises eight photographic steps, and the transformation of the process is less. Thereby, the present embodiment reduces the photographic steps by one and the difficulty of the process, in comparison with the conventional process. In addition, a half-tone mask technique can further reduce the photographic steps by one in the present embodiment.

Although the present invention has been explained in relation to its preferred embodiment, it is to be understood that many other possible modifications and variations can be made without departing from the spirit and scope of the invention as hereinafter claimed.

What is claimed is:

1. A method for manufacturing a lower substrate of a liquid crystal display device, comprising:
    (A) providing a substrate;
    (B) forming plural transistors individually comprising a gate, a source, and a drain, wherein the gate is disposed on the substrate, at least one semiconductor layer and at least one gate insulating layer are sandwiched in between the gate and the source/drain, and the drain does not electrically connect to the source;

(C) forming on the substrate in sequence a first photosensitive insulating layer and a black matrix, wherein the first insulating layer and the black matrix are the same type of photoresist;

(D) patterning the first photosensitive insulating layer and the black matrix to cover the transistor regions, wherein the pattern of the first photosensitive insulating layer is the same as that of the black matrix;

(E) forming on the substrate in sequence a second insulating layer and a color filter layer, wherein the second insulating layer and the color filter layer are the same type of photoresist;

(F) patterning the second insulating layer and the color filter layer, and simultaneously forming a first contact hole corresponding to the drain, wherein the first contact layer extends through the second insulating layer and the color filter layer so as to expose the part drain;

(G) selectively repeating the steps (E) and (F); and (H) forming a patterned transparent electrode layer on the substrate, which electrically connects to the drain.

2. The method as claimed in claim 1, wherein step (B) further comprises a step for forming plural connecting terminal regions each at least comprising a terminal line on the substrate, and the gate insulating layer is disposed on the terminal line.

3. The method as claimed in claim 2, wherein step (F) further comprises a step for simultaneously forming a second contact hole in the connecting terminal region, and the second contact hole at least extends through the second photosensitive insulating layer and the filter layer so as to expose part of the gate insulating layer.

4. The method as claimed in claim 3, further comprising step (G') between step (G) and step (H), dryly etching the exposed gate insulating layer so as to expose part of the terminal line.

5. The method as claimed in claim 1, wherein step (B) further comprises a step for forming plural connecting terminal regions each at least comprising a terminal line and a connecting line, the terminal line is disposed on the substrate, the gate insulating layer is sandwiched in between the terminal line and the connecting line, and the terminal line connects to the connecting line via a through hole.

6. The method as claimed in claim 5, wherein step (F) further comprises a step for forming a second contact hole in the connecting terminal region, and the second contact hole at least extends through the second photosensitive insulating layer and the filter layer so as to expose part of the connecting line.

7. The method as claimed in claim 1, wherein step (B) further comprises a step for forming plural auxiliary capacitance regions each at least comprising a lower electrode, a gate insulating layer, and an upper electrode, the lower electrode is disposed on the substrate, and the gate insulating layer is sandwiched in between the upper electrode and the lower electrode.

8. The method as claimed in claim 1, wherein the process for patterning the first photosensitive insulating layer and the black matrix of step (D) is performed by a mask, so as to expose and develop the first photosensitive insulating layer and the black matrix.

9. The method as claimed in claim 1, wherein the process for forming the color filter layer of step (F) is performed by spin coating.

10. The method as claimed in claim 1, wherein the process for forming the color filter layer of step (F) is performed by ink-jet printing.

11. The method as claimed in claim 1, wherein the color of the color filter layer corresponding to one of the transistors is different from that of the neighboring color filter layer corresponding to another of the transistors.

12. A method for manufacturing a lower substrate of a liquid crystal display device, comprising:

(A) providing a substrate;

(B) forming plural transistor regions individually having a gate, a source, and a drain, wherein the gate is disposed on the substrate, at least one semiconductor layer and at least one gate insulating layer are sandwiched in between the gate and the source/drain, and the drain does not electrically connect to the source;

(C) forming on the substrate in sequence a passivation layer, a black matrix, and a first photosensitive insulating layer;

(D) patterning the first photosensitive insulating layer and the black matrix to cover the transistor regions, wherein the pattern of the first photosensitive insulating layer is the same as that of the black matrix;

(E) forming on the substrate in sequence a second insulating layer and a color filter layer;

(F) patterning the second insulating layer and the color filter layer, and simultaneously forming a first contact hole in the second insulating layer and the color filter layer on the drain, wherein the first contact hole extends through the second insulating layer and the color filter layer so as to expose part of the passivation layer;

(G) selectively repeating steps (E) and (F);

(H) dryly etching the passivation layer in the first contact hole to expose part of the drain; and (I) forming a patterned transparent electrode layer on the substrate, which electrically connects to the drain.

13. The method as claimed in claim 12, wherein step (B) further comprises a step for forming plural connecting terminal regions each at least comprising a terminal line on the substrate, and the gate insulating layer is sandwiched in between the terminal line and the passivation layer.

14. The method as claimed in claim 13, wherein step (F) further comprises a step for simultaneously forming a second contact hole in the connecting terminal region, and the second contact hole extends through the second photosensitive insulating layer and the color filter layer so as to expose part of the passivation layer.

15. The method as claimed in claim 14, wherein step (H) further comprises a step for dryly etching the passivation layer and the gate insulating layer in the second contact hole so as to expose part of the terminal line.

16. The method as claimed in claim 12, wherein step (B) further comprises a step for forming plural auxiliary capacitance regions each at least comprising a lower electrode, a gate insulating layer, and an upper electrode, the lower electrode is disposed on the substrate, and the gate insulating layer is sandwiched in between the upper electrode and the lower electrode.

17. The method as claimed in claim 12, wherein the process for patterning the first photosensitive insulating layer and the black matrix of step (D) is performed by a mask so as to expose and develop the first photosensitive insulating layer and the black matrix.

18. The method as claimed in claim 12, wherein the process for forming the color filter layer of step (F) is performed by spin coating.

19. The method as claimed in claim 12, wherein the process for forming the color filter layer of step (F) is performed by ink-jet printing.

20. The method as claimed in claim 12, wherein the color of the color filter layer corresponding to one of the transistors is different from that of the neighboring color filter layer corresponding to another of the transistors.

* * * * *